United States Patent [19]

Meador et al.

[11] 4,107,598
[45] Aug. 15, 1978

[54] ELECTROMAGNETIC WAVE LOGGING SYSTEM FOR DETERMINING RESISTIVITY AND DIELECTRIC CONSTANT OF EARTH FORMATIONS

[75] Inventors: Richard A. Meador, Houston; Larry L. Adams, Stafford; James A. Fuchs, Missouri City; Percy T. Cox; Larry W. Thompson, both of Houston, all of Tex.

[73] Assignee: Texaco Inc., New York, N.Y.

[21] Appl. No.: 800,500

[22] Filed: May 25, 1977

Related U.S. Application Data

[63] Continuation of Ser. No. 654,450, Feb. 2, 1976, abandoned.

[51] Int. Cl.² .......................... G01V 3/18; G01V 3/12
[52] U.S. Cl. ............................................ 324/6; 324/85
[58] Field of Search ........................................ 324/6, 85

[56] References Cited

U.S. PATENT DOCUMENTS

| | | | |
|---|---|---|---|
| 2,900,595 | 8/1959 | Mengel et al. | 324/6 |
| 3,900,879 | 8/1975 | Lewinter | 324/85 X |
| 3,944,910 | 3/1976 | Rau | 324/6 |
| 3,993,944 | 11/1976 | Meador et al. | 324/6 |
| 4,012,689 | 3/1977 | Cox et al. | 324/6 |

FOREIGN PATENT DOCUMENTS

| | | | |
|---|---|---|---|
| 212,387 | 10/1969 | U.S.S.R. | 324/6 |
| 272,450 | 11/1970 | U.S.S.R. | 324/6 |

Primary Examiner—Gerard R. Strecker
Attorney, Agent, or Firm—Carl G. Ries; Thomas H. Whaley; William J. Beard

[57] ABSTRACT

A system operating at radio frequencies in the range of 10 MHZ to 60 MHZ is provided for simultaneously determining the resistivity and dielectric constant of earth formations in the vicinity of a well bore. A transmitter coil and two longitudinally spaced receiver coils are provided in the system. Circuit means for measuring the unnormalized amplitude ratio and the relative phase shift of electromagnetic waves at the spaced receiver coils are provided. A relationship is given whereby the formation dielectric constant and resistivity may be obtained from the amplitude ratio and relative phase shift measurements.

4 Claims, 2 Drawing Figures

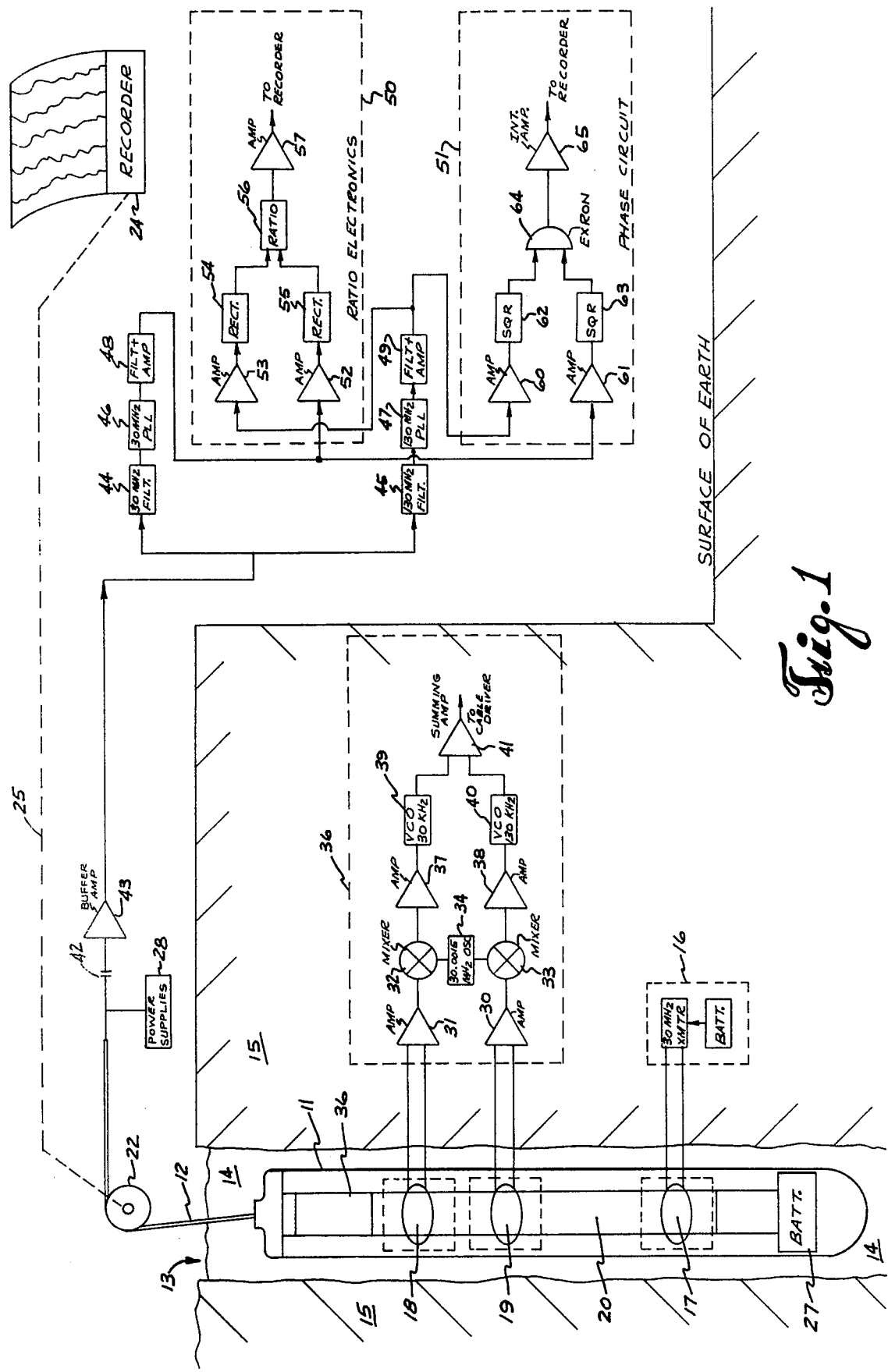

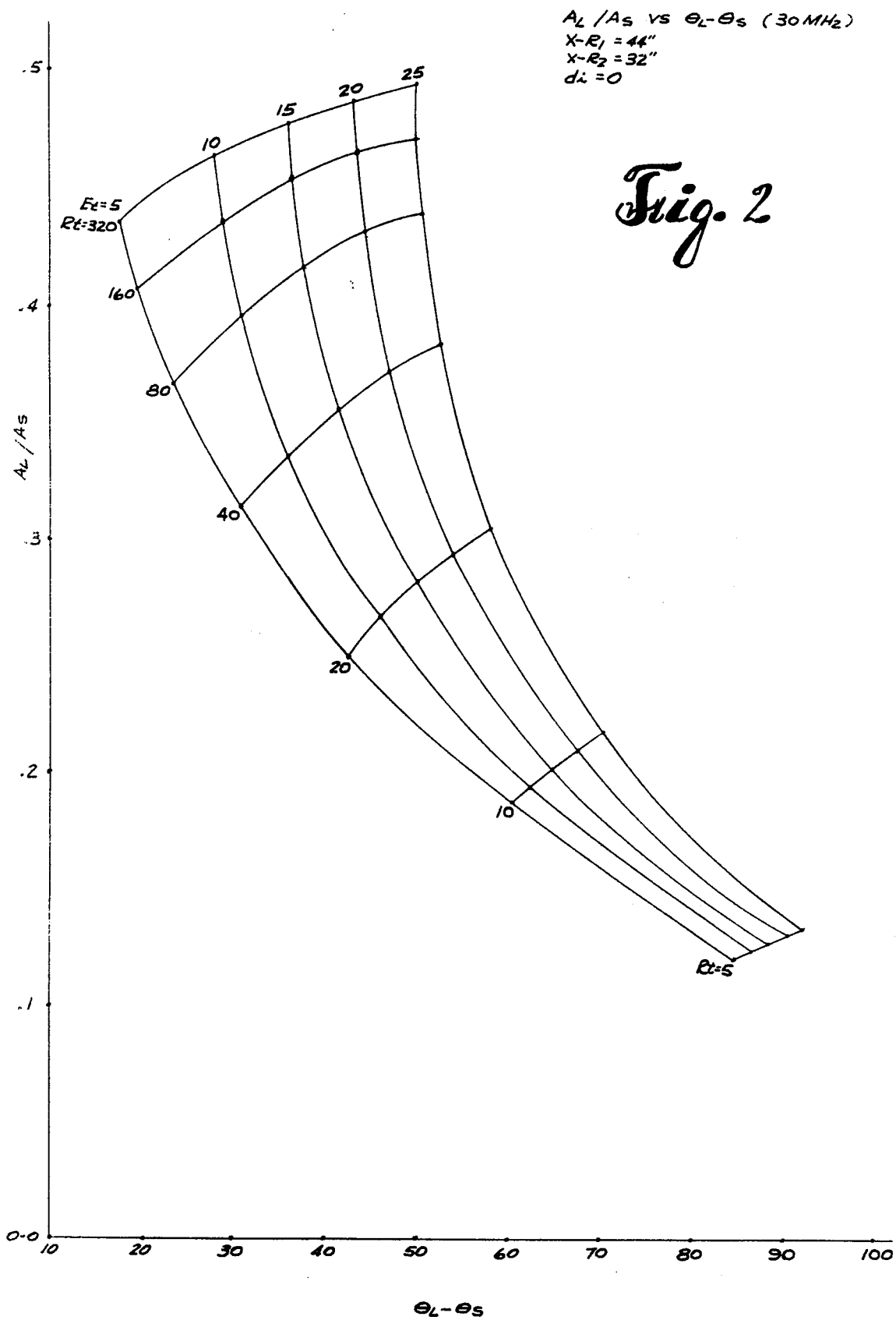

ELECTROMAGNETIC WAVE LOGGING SYSTEM FOR DETERMINING RESISTIVITY AND DIELECTRIC CONSTANT OF EARTH FORMATIONS

This application is a continuation of application Ser. No. 654,450, filed Feb. 2, 1976, now abandoned.

FIELD OF THE INVENTION

This invention relates to methods and apparatus for determining the electromagnetic characteristics of materials surrounding a well bore, and more particularly, relates to methods and apparatus for radio frequency dielectric induction well logging wherein the formation resistivity and permittivity (or dielectric constant) are simultaneously determinable by a means of in situ electromagnetic wave propagation measurements taken in a well borehole.

DESCRIPTION OF THE PRIOR ART

It has been conventional practice in the prior art to log the electrical resistivity (or conductivity) of earth formations in the vicinity of a well borehole in order to determine the location of oil bearing strata. This has been made possible in the prior art by the use of electrical resistivity logs in wells using highly conductive (low resistivity) drilling fluid and by the use of induction well logs in wells drilled with oil base drilling muds or drilling fluids having higher resistivities. In conventional resistivity logs a current emitting electrode (or electrode array arranged for focusing the emitted current) is used to emit either direct current or very low frequency (such as 60 hertz) alternating current into the earth formation surrounding the well borehole by means of contacting electrodes. These currents traverse a section of the earth formations and voltage representations thereof are detected at a measurement electrode situated a spaced distance from the current emitting electrode. The magnitude of the detected currents can then provide an indication of the resistivity of the earth formations surrounding the well bore. In more specialized equipment current electrodes are used in conjunction with focusing electrodes to determine the formation resistivity at different radial depths of inewtigation in the earth formations arround the wellbore.

In electrical induction logging it has been conventional practice in the prior art to provide a well logging sonde having a transmitting coil (or array) disposed thereon and a receiver coil (or array) at a spaced distance therefrom. Generally a relatively high frequency alternating electric current is passed through the transmitter coil (normally at a frequency of approximately 20 kilohertz). The resulting magnetic fields produced by electromagnetic induction from this high frequency alternating current in the earth formations surrounding the well bore are detected at the spaced receiver coil by sensing the induced currents or voltages in the receiver coil caused by the secondary currents flowing in the formations.

In both of these types of prior art resistivity (or conductivity) logging systems the usefulness of the system arises from the fact that earth formations having pore spaces therein filled with hydrocarbon molecules exhibit a higher resistivity (i.e. lower conductivity) than those earth formations having the pore spaces therein filled with some other more conductive interstitial fluid. Thus a high resistivity formation was usually interpreted as oil bearing.

Various problems have arisen in the interpretation of either conventional induction logging records or resistivity logging records of wells in geographical areas where relatively fresth connate formation waters (such as less than 10,000 parts per million sodium chloride) are encountered. Such relatively fresh water bearing sands or earth formations exhibit relatively higher resistivities (or lower conductivities) much the same as those encountered in hydrocarbon bearing formations. In these cases it is difficult to distinguish on the basis of the electric resistivity or induction well logging measurements alone whether an earth formation which is a prospective producing zone contains fresh water or hydrocarbon. It would therefore be very beneficial to provide a well logging system which, on the basis of a single measurement of some of the physical characteristics of the earth formations in the vicinity of a well bore hole, could distinguish between fresh water bearing and hydrocarbon bearing earth formations.

One such system is provided in U.S. Pat. No. 3,891,916, which is assigned to the assignee of the present invention, for a dual radio frequency amplitude measurement induction dielectric well log. The present invention uses induction dielectric logging techniques of the same general character as disclosed in this patent, but, rather than operating to measure the signal amplitude alone at two different frequencies, makes measurements of the unnormalized amplitude ratio and relative phase shift between two receivers at the same frequency. By appropriately combining these measurements according to predetermined relationships, the dielectric constant (permittivity) and resistivity of the earth formations in the borehole vicinity may be determined. This information is useful in distinguishing oil bearing from fresh water bearing earth formations.

BRIEF DESCRIPTION OF THE INVENTION

In the well logging system of the present invention a downhole well logging sonde is provided which contains radio frequency dielectric induction measurement apparatus. The radio frequency dielectric induction logging apparatus comprises a 30 megahertz transmitting apparatus together with a longitudinally spaced dual coil receiving apparatus. At this radio frequency the signal may be thought of as a propagatin electromagnetic wave. The physical characteristics of the earth formations surrounding the well bore which influence the propagation of this wave in the earth formations include both the dielectric constant (or permittivity) of the earth formations together with the conductivity (or resistivity) characteristics of the earth formations in the vicinity of the borehole. By measuring the ratio of the unnormalized amplitudes of the received signal at each of these two different spaced receiver coils together with the relative phase shift of the propagated wave between the receiver coils, both the permittivity characteristics and the resistivity characteristics of the earth formations in the vicinity of the borehole may be determined. Novel apparatus for performing these amplitude ratio and phase shift measurements at the radio frequency is provided.

Other advantages of the invention will be more apparent from the following detailed description. The invention is best understood by reference to the following detailed description thereof when taken in conjunction with the accompanying drawings.

BRIEF DESCRIPTION OF THE DRAWINGS

FIG. 1 is a block diagram schematically illustrating the overall layout of a radio frequency dielectric induction logging system in accordance with the present invention;

FIG. 2 is a theoretically derived cross plot of the unnormalized amplitude ratio vs. relative phase shift response of the two reciver coil system of FIG. 1 showing the response of this system for a range of formation permittivity and resistivity values.

DETAILED DESCRIPTION OF THE INVENTION

Induction and electrical resistivity logs have not proven entirely adequate in the past in locating oil bearing sands in the vicinity of a well borehole due to the fact that fresh water sands and oil sands can have similar high resistivities. At radio frequencies, however, the possibility of simultaneously measuring both the formation electrical conductivity and formation permittivity (dielectric constant) can provide a means for distinguishing these types of liquid bearing strata. Hydrocarbons have a characteristically low dielectric constant $\epsilon_r$, less than 5. On the other hand fresh water has a relatively high dielectric constant $\epsilon_r$, approximately equal to 80. The permittivity of a material $\epsilon$, is defined as the natural electrical polarization of this material. In this description the terms relative permittivity and dielectric constant $\epsilon_r$ will be used synonymously. These quantities are related to the permittivity of free space $\epsilon_0$ by the relationship given in Equation 1:

$$\epsilon = \epsilon_r \epsilon_0 \quad (1)$$

where $\epsilon_0 = 8.854$ picofarads per meter, the permittivity of free space.

From electromagnetic field theory, and in particular from the theory of a point source oscillating magnetic dipole, the behavior of radio frequency field in the vicinity of a cylindrical borehole may be expressed as in Equation 2 (the Helmholtz Equation in conventional cylindrical coordinates $\rho$, $\phi$, and $z$)

$$\left[ \frac{1}{\rho} \frac{\partial}{\partial \rho} \left( \rho \frac{\partial}{\partial \rho} \right) + \frac{1}{\rho^2} \frac{\partial^2}{\partial \phi^2} + \frac{\partial^2}{\partial z^2} + k^2 \right] \pi_z^{(m)} = \frac{-j}{\omega \mu} I^{(m)} \frac{\delta(\rho) \delta(z)}{\rho} \quad (2)$$

where
$\pi_z^{(m)}$ is the Hertz magnetic vector;
$I_{(m)}$ the magnitude of the current; and
$j = \sqrt{-1}$.
$k$ is the complex wave nunber given by Equation 3:

$$k^2 = \omega^2 \mu \epsilon + j \omega \mu \rho \quad (3)$$

In Equation 2, $\delta_{(p)}$ and $\delta_{(z)}$ are unit impulse functions of the Dirac type.

$\omega = 2\pi f$ the radian frequency where $f$ is the frequency of oscillation of the point magnetic dipole.

$\epsilon$ is the electric permittivity of the media.

$\mu$ is the magnetic permittivity of the material surrounding the magnetic dipole and $\partial$ is the electrical conductivity of the medium (i.e. the reciprocal of its resistivity).

It will be observed that there are three physical constants associated with the material surrounding the oscillating point magnetic dipole in the above equations. These are the relative magnetic permeability $\mu$, the electrical permittivity $\epsilon$, and the electrical conductivity $\sigma$. For most earth formations at the frequencies of interest (10 to 60 megahertz) with respect to the present invention the relative magnetic permeability $\mu$ may be taken as a constant. Variations in $\mu$ in the earth materials of interest generally fall in the range of 0.001 to 0.1 percent. Thus, the only two media constants contributing a significant variation from one earth material to another at the frequencies of interest are $\epsilon$ and $\sigma$. These two physical characteristics have a direct effect on any very high frequency alternating electrical current flowing in the media. Both of these physical properties of the media have an effect on the amplitude and the phase with respect to the transmitter of the induced currents in formations in the vicinity of a well borehole.

Assuming a point magnetic source placed in a cylindrical borehole and responding to the Helmhotz equation (i.e. Equation 2), the total field is defined as the field at the frequency of the source which is sensed by a receiver coil in any medium. The total field may be separated into a primary field and a secondary field. The primary field is defined to be the field at the frequency of the source which is sensed by the receiver coil in some reference medium (such as vacuum or air). The secondary field is defined as the field which, when added vectorially to the primary field, results in the total field. The primary field has an amplitude and a phase which are equal to the amplitude and phase of the total field in the reference medium. When the source is placed in a medium which is different from the reference medium, the secondary field adds vectorially to the primary field to produce the total field within the new medium. The primary field serves as an amplitude and phase reference for the determination of the secondary field.

The currents that flow in the medium surrounding the oscillating point magnetic dipole are called eddy currents. The eddy currents generate secondary fields, which in the case of a conductive medium, act to opposite the primary or reference field. However, when $\omega\epsilon$ (the angular operating frequency multiplied by the electrical permittivity) approaches the magnitude of $\sigma$ (the electrical conductivity) the eddy currents are phase shifted and may actually result in secondary fields which increase the magnitude of the total field. This is commonly the case when operating at the frequencies of interest in the present invention which generally may be stated to comprise radio frequencies from 10 to 60 megahertz.

Since changes in both $\epsilon$ and $\sigma$ effect changes in the eddy currents at any given frequency, the measurement of a single field amplitude cannot separate the two effects. However, in accordance with the principles of the present invention, the measurement of the unnormalized amplitude ratio of the total field at two different longitudinally spaced receiver coils may be combined with a measurement of the relative phase shift of the field between the two receiver coils to simultaneously determine resistivity and permittivity of the formation.

Another way of viewing the time varying electromagnetic field in the vicinity of the borehole at the radio frequencies of interest with respect to the present invention is as a propagating electromagnetic wave. Electromagnetic wave propagation within a medium is characterized by two primary factors. One of these factors is the propagation velocity, $v_p$, of the wave. The other factor may be regarded as the attenuation, $\alpha$. The measurement of the attenuation $\alpha$, and the propagation velocity, $v_p$, can then provide a unique determination of the resistivity and dielectric constant of the propagation medium. Since the propagation velocity, $v_p$, is very high for electromagnetic waves in earth formations (approaching $c$, the speed of light in free space), for practical measurement distances for the spacing of two receiver coils in a well borehole, the passage of a wave front past each of two such coils manifests itself as a relative phase shift of the wave front between the two spaced receiver coils rather than two discrete time separated events. Thus, in the present invention the measurement of the relative phase shift of the total field between two receiver coils longitudinally spaced in a borehole represents a measurement of the velocity of propagation, $v_p$, of the total field in the formation.

Similarly, since the propagation velocity, $v_p$, is so great, a time average of the amplitude ratio of the total field at two longitudinally spaced receiver coils may be thought of as a continuous time average of the amplitude of the same electromagnetic wave as it passes each of the receiver coils. Hence the difference in amplitude between the receiver coils (or the ratio of amplitudes at the two spaced receiver coils) reflects the attenuation, $\alpha$, of the wave by the medium between the two coils.

Consider an electromagnetic wave generated at a location A and propagating radially in all directions. The time dependence of such a wave may be expressed mathematically as $A_A e^{j\omega t}$ where $A_A$ represents the complex amplitude of the wave at location A and $\omega$ is its radian frequency. $j$ and $e$ are as previously defined (i.e. $j = \sqrt{-1}$ and $e$ = naperian logarithm base).

At some point B an arbitrary distance from A a receiver $R_1$ is located. Here the time dependence of the wave is $A_B e^{j(\omega t + \theta_1)}$ where $A_B$ is the wave amplitude at B and $\theta_1$ is the phase of the wave at B relative to A. Similarly at a third point C on the same line as B and A and spaced a distance Z along this line joining A, B and C from point B, a second receiver $R_2$ is located. The time dependence of the wave is given by $A_c e^{j(\omega t + \theta_2)}$. Here again $A_c$ is the complex wave amplitude at C and $\theta_2$ is the phase of the wave at C relative to A.

Taking the ratio of the received signals at $R_1$ and $R_2$ we have $$\text{RATIO} = \frac{A_c e^{j(\omega t + \theta_2)}}{A_B e^{j(\omega t + \theta_1)}} = \frac{A_c}{A_B} e^{j(\theta_2 - \theta_1)} \quad (4)$$

Recalling the distance apart, Z, of the receivers $R_1$ and $R_2$ and the definition of the radian frequency $\omega$ we then have $$V_p = \frac{\omega}{\theta_2 - \theta_1} \cdot Z \quad (5)$$

and the attenuation, $\alpha$, given by $$\alpha = A_c / A_B \quad (6)$$

By computer evaluation of the solution of the Helmholtz equation (i.e. equation 2) a theoretically derived nomograph for the behavior of such an induction dielectric electromagnetic wave propagation logging system in a homogeneous medium may be derived. The graphical relationship of FIG. 2 represents such a nomograph derived in this manner from the coil spacings listed thereon (i.e. 32 inches to a near receiver coil and 44 inches to a far receiver coil.) It will be noted that the amplitude ratio in FIG. 2 in an "unnormalized" amplitude ratio. That is the ratio represents the ratio of actual voltage at the receiver coils without modification prior to obtaining this ratio. The relationship shown in FIG. 2 illustrates the response of such a system for a variety of formation resistivities $R_T$ from about 5 ohm/meters to about 320 ohm/meters and for a range of formation dielectric constant values from about $5\epsilon_o$ to about $25\epsilon_o$. Thus if a well logging system is provided which is capable of measuring the unnormalized amplitude ratio at a long spaced to a short spaced receiver coil, $A_L/A_S$, and the relative phase shift between the two receiver coils, $\theta_L - \theta_s$, graphical relationships such as that of FIG. 2 may be used to determine uniquely the resistivity $R_T$ of the homogeneous formation and the permittivity $\epsilon_T$ of the homogeneous formation.

It will be appreciated by those skilled in the art that while the nomograph of FIG. 2 assumes no invasion of borehole fluid into the formation and assumes a homogeneous medium of wave propagation, that such graphical representations may be derived for other than these conditions by applying appropriate boundary conditions to the solutions of Equation 2. In such instances, however, it may be necessary to measure more than one phase shift and amplitude ratio to derive the various resistivities R and dielectric constants $\epsilon$ of the various cylindrically layered portions of the borehole media. Similarly for different transmitter to receiver spacings other relationships analogous to FIG. 2 will apply.

Another approach to measuring $\epsilon_T$ and $R_T$ would be empirically derived relationsip analogous to FIG. 2 by measurements of the unnormalized amplitude ratio $A_L/A_s$ and phase shift $\theta_L - \theta_s$ in test boreholes under controlled conditions while varying $\epsilon_T$ and $R_T$ in a known manner. From a series of such measurements then a graphicl relationship analogous to FIG. 2 may be obtained. However obtained, such relationships may be stored in tabular form in the memory of a general purpose digital computer, for example, and used to generate the desired measurement of $\epsilon$ and R from the $A_L/A_s$ and $\theta_L - \theta_s$ meaurements when these are made in the unknown borehole conditions to be logged. Appropriate interpolation or curve fitting techniques for deriving the $\epsilon$ and R measurements will be apparent to those skilled in the art when provided with the relationship of FIG. 2 for a particular borehole environment. A small general purpose digital computer such as the PDP-11 furnished by the Digital Equipment Corporation of Cambridge, Massachusetts may be programmed in a commonly used compiler language such as FORTRAN to derive the formation dielectric constant and resistivity from the amplitude ratio and phase shift measurements in this manner.

Referring now to FIG. 1, a dual receiver induction dielectric well logging system in accordance with the concepts of the present invention is illustrated schematically. A well logging sonde 11 whose main body member is preferably constructed of fiber glass or some other nonconducting material of sufficient strength characteristics, is shown suspended by a well logging cable 12 in an uncased well borehole 13 is filled with a borehole fluid 14 and is surrounded by earth formations 15 whose permittivity and conductivity properties are to be measured.

The lower portion of the well logging sonde 11 is seen to be basically comprised of a transmitter electronics section 17 and an associated transmitting coil 17. The transmitting coil 17 is wound about a central strength member or mandrel 20. This mandrel 20 is also preferably comprised of a nonconducting material such as fiberglass or the like. The transmitter coil 17 is operated at a frequency of 30 megahertz and will be described in more detail subsequently. Dual receiver coils 18 and 19 which are helically wound on mandrel 20 comprise dual receivers which are sensitive at a frequency of 30 megahertz.

The coil mandrel 20 has a 2 inch outside diameter and a ⅝ inch inside diameter and it and the associated downhole electronics, to be described in more detail subsequently, are housed inside the pressure tight sonde body 11. The transmitter coil 17 comprises 4 turns of ⅛ inch copper tubing spaced ⅜ inch apart. The receiver coils 18 and 19 are each single turn coils. Receiver coil 19 is located 44 inches from the transmitter coil. Both the transmitter coil 17 and receiver coils 18 and 19 are electrostatically shielded as indicated by the dotted line boxes around these coils. The coil spacings just recited are intended as being illustrative only and it will be appreciated by those skilled in the art that other operating frequencies in the range of interest for practicing the invention and other coil spacings than these, may be used without departing from the invention concepts.

A conventional winch arrangement (not shown) at the surface is used for moving the sonde 11 through the borehole during the well logging operation. The sheave wheel 22 over which cable 12 passes may be electrically or mechanically linked as indicated by dotted line 25 to a data recorder 24 which is used to record processed signals from the downhole sonde 11 as a function of its depth in the borehole 13. Power for operation of the down hole receiver electronics 36 is provided on conductors of the well logging cable 12 by a surface power source 28. Power for operation of the transmitter 16 is supplied from a downhole battery pack 27 which is mechanically arranged for easy detachment and replacement at the lower end of the sonde 11.

Receiver electronics section 36 is schematically illustrated in more detail in the dotted box to the right of the downhole sonde. Output from each of the receiver coils 18 and 19 is supplied to two identical signal conversion receiver systems. Identical input amplifiers 30 and 31 amplify the receiver coil 18 and 19 signals and supply these amplified signals as inputs to two identicl mixer circuits 32 and 33. Mixer circuits 32 and 33 are each supplied with 30.0015 MHZ signals from the same crystal controlled oscillator 34. Since only one oscillator 34 is used this mixing process maintains the integrity of the phase information which is present in the original 30 MHZ signals at the two receiver coils 18 and 19. The output of mixers 32 and 33 is a pair of 1.5KHZ signals having this phase and amplitude information intact. The 1.5KHZ signals are amplified in identical broadband amplifiers 37 and 38 and supplied as modulation inputs to a 30KHZ voltage controlled oscillator (VCO) 39 and a 130KHZ voltage controlled oscillator (VCO) 40.

The 30KHZ VCO 39 operates at a nominal center frequency of 30KHZ and is frequency modulated about this carrier frequency but the 1.5KHZ signal supplied to it from the broadband amplifier 37. Similarly the 130KHZ VCO 40 is frequency modulated by the 1.5KHZ output of broadband amplifier 38. Thus the output signals from VCO's 39 and 40 comprise a pair of frequency modulated signals at 30KHZ and 130KHZ which contain in their modulation components all the amplitude and phase information present at receiver coils 18 and 19. The outputs from VCO's 39 and 40 are coupled to a summing amplifier 41 and thereby summed together for transmission to the surface by a conventional cable driver circuit (not shown). The signal is then transmitted to the surface via the well logging cable 12.

At the surface the summed output signal from VCO's 39 and 40 is AC coupled via an isolation capacitor 42 to a buffer amplifier 43. The output of buffer amplifier 43 is supplied to a 30KHZ bandpass filter circuit 44 and to a 130KHZ bandpass filter circuit 45. The filter circuits 44 and 45 separate the two carrier frequency components again into the 30KHZ and 130KHZ components representing the frequency modulated outputs of downhole VCO's 30 and 40 as previously described.

The 30KHZ output of bandpass filter 44 is demodulated by supplying it to a phase locked loop (PLL) demodulator circuit 46. Similarly the 130KHZ output of bandpass filter 45 is demodulated by supplying it to a phase locked loop (PLL) demodulator circuit 47. Thus the outputs of PLL's 46 and 47 comprise the 1.5KHZ signals containing all the amplitude and phase information of the original 30MHZ signals present at the receiver coils 18 and 19 as previously described.

After further filtering by matched lowpass filter and amplifier circuits 48 and 49, the 1.5KHZ signal outputs from PLL 46 (representative of the 30MHZ signal at receiver coil 18) and PLL 47 (representative of the 30MHZ signal at receiver coil 19) are each supplied to an amplitude ratio detector circuit 50 and to a relative phase detector circuit 51

The amplitude ratio detector circuit 50 operates as follows. The 1.5KHZ signal representative of the near coil 19 original 30 MHZ signal is supplied to an input amplifier 53. The 1.5KHZ signal representative of the far coil 18 original 30 MHZ signal is supplied to an input amplifier 52. The output pf amplifiers 52 and 53 are supplied to rectifier circuits 55 and 54 respectively. The rectifier circuit each function to product a DC output signal which is representative of the amplitude of their respective inputs. These DC output signals are supplied to a conventional divider circuit 56 which thus provides an output signal representative of the ratio of the amplitude of the original 30 MHZ signals at each of the receiver coils 19 and 18 in the downhole sonde 11 (i.e. $A_{18}/A_{19}$). This ratio output is supplied to a recorder amplifer 59 from whence it is supplied to the recorder 24. Alternatively this output signal may be supplied to an analog to digital converter (not shown) and converted to digital form for input to a small general purpose digital computer as previously discussed or to be recorded on magnetic tape for such use at a remote processing location.

The phase detector circuit 51 operates as follows. The 1.5 KHZ signal representative of the near coil 19 original 30 MHZ signal is supplied to an input amplifier 60. The 1.5KHZ signal for coil 18 representative of the original 30 MHZ signal is supplied to an input amplifier 61. The sinusoidal 1.5KHZ outputs of amplifiers 60 and 61 are supplied respectively to a pair of identical zero crossing disciminators 62 and 63 which convert the 1.5KHZ sine wave inputs to a square wave shape with the same zero crossing points, thereby preserving the phase shift information present on these signals. The square wave output of zero crossing discriminator circuits 62 and 63 are then supplied as inputs to an exclusive NOR logic gate 64. The output pulse width in time produced by exclusive NOR logic gate 64 is thus proportional to the phase difference between its two square wave inputs. The pulse output of exclusive NOR gate 64 is amplified and integrated by integration amplifier 65 to provide a DC output voltage which is proportional to the phase difference of the original 30 MHZ signal between receiver coils 18 and 19 in the downhole sonde.

The phase difference output signal from integrator amplifier 65 may either be supplied directly to the recorder 24 or converted to digital form for input to a general purpose digital computer (not shown) as previously described for further processing.

The foregoing descriptions may take alternative embodiments of the invention apparent to those skilled in the art. The aim of the appended claims is to cover all such alternative arrangements which come within the true inventive concepts of the present invention.

We claim:

1. A method for determining the electromagnetic properties of earth formations in the vicinity of a well borehole, comprising the steps of:

generating propagating electromagnetic waves at a frequency of approximately 30 megahertz in a well borehole;

detecting said propagating electromagnetic waves at a first shorter longitudinally spaced location in the borehole and converting said detected waves to a first intermediate frequency signal at least two orders of magnitude less than said generated frequency while preserving absolute phase and amplitude information present on said detected waves in the conversion process;

detecting said propagating electromagnetic waves at a second, longer longitudinally spaced location in the borehole and converting said detected waves to a second, different frequency, intermediate frequency signal at least two orders of magnitude less than said generated frequency while preserving absolute phase and amplitude information present on said detected waves in the conversion process;

transmitting said first and second intermediate frequency signals to the surface of the earth;

receiving, at the surface of the earth, said first and second intermediate frequency signals and extracting therefrom the unnormalized ratio of the amplitude components present at said first and second longitudinally spaced locations in the borehole and the relative phase shift of said propagating waves between said first and second longitudinally spaced locations in the borehole; and recording said unnormalized amplitude ratio and said relative phase shift as a function of borehole depth.

2. The method of claim 1 and further including the steps of deriving from a predetermined relationship the dielectric constant and resistivity of earth formations in the vicinity of the borehole as a function of said unnormalized amplitude ratio and said relative phase shift information.

3. The method of claim 1 wherein the steps are performed repetitively at different depth levels in the borehole and the relative phase shift and unnormalized amplitude ratio information is recorded as a function of borehole depth.

4. The method of claim 2 wherein the steps are performed repetitively at different depth levels in the borehole and the dielectric constant and resistivity is recorded as a function of borehole depth.

* * * * *